(12) United States Patent
Sigle et al.

(10) Patent No.: US 10,154,185 B2
(45) Date of Patent: Dec. 11, 2018

(54) VEHICLE CAMERA WITH SMD PAD FOR COAXIAL CABLE CONNECTION

(71) Applicant: MAGNA ELECTRONICS INC., Auburn Hills, MI (US)

(72) Inventors: Marc-Andre Sigle, Alzenau (DE); Achim Newiger, Aschaffenburg (DE); Christian Mai, Grossostheim (DE); Benjamin Peter, Laufach (DE)

(73) Assignee: MAGNA ELECTRONICS INC., Auburn Hills, MI (US)

(*) Notice: Subject to any disclaimer, the term of this patent is extended or adjusted under 35 U.S.C. 154(b) by 0 days.

(21) Appl. No.: 15/619,628

(22) Filed: Jun. 12, 2017

(65) Prior Publication Data

US 2017/0366716 A1   Dec. 21, 2017

Related U.S. Application Data

(60) Provisional application No. 62/351,321, filed on Jun. 17, 2016.

(51) Int. Cl.
| | | |
|---|---|---|
| *H04N 5/225* | (2006.01) | |
| *H05K 3/30* | (2006.01) | |
| *G06T 1/00* | (2006.01) | |
| *H05K 3/34* | (2006.01) | |
| *H05K 3/00* | (2006.01) | |
| *H01R 12/57* | (2011.01) | |
| *H01R 24/50* | (2011.01) | |

(52) U.S. Cl.
CPC ......... *H04N 5/2257* (2013.01); *G06T 1/0007* (2013.01); *H05K 3/0008* (2013.01); *H05K 3/303* (2013.01); *H05K 3/341* (2013.01); *H01R 12/57* (2013.01); *H01R 24/50* (2013.01)

(58) Field of Classification Search
CPC ......... H01R 24/50; H05K 2201/09809; H05K 3/341; H04N 5/2257; G06T 1/0007
USPC ..................................................... 439/63, 581
See application file for complete search history.

(56) References Cited

U.S. PATENT DOCUMENTS

| | | |
|---|---|---|
| 5,550,677 A | 8/1996 | Schofield et al. |
| 5,670,935 A | 9/1997 | Schofield et al. |
| 5,791,911 A * | 8/1998 | Fasano .................. H01R 12/57 439/63 |
| 5,949,331 A | 9/1999 | Schofield et al. |
| 7,965,336 B2 | 6/2011 | Bingle et al. |

(Continued)

*Primary Examiner* — Vanessa Girardi
(74) *Attorney, Agent, or Firm* — Honigman Miller Schwartz and Cohn, LLP (57) ABSTRACT

A camera for a vehicle vision system includes a front housing portion, a circuit board, and a rear housing portion having a connector portion for connection of a vehicle coaxial cable. The circuit board includes a first solder pad for soldering a core pin connecting element, and a second solder pad that partially circumscribes the first solder pad for soldering a shielding connecting element. The second solder pad only partially circumscribes the first solder pad so as to have a gap between opposing ends of the second solder pad. The gap is configured to allow for escape of gases that evaporate out of the solder during the soldering process. The core pin connecting element electrically connects between a core pin of the connected coaxial cable and circuitry of the circuit board and the shielding connecting element electrically connects between shielding of the coaxial cable and circuitry of the circuit board.

15 Claims, 6 Drawing Sheets

(56) References Cited

U.S. PATENT DOCUMENTS

| | | |
|---|---|---|
| 8,503,061 B2 | 8/2013 | Uken et al. |
| 8,542,451 B2 | 9/2013 | Lu et al. |
| 8,866,907 B2 | 10/2014 | McElroy et al. |
| 8,911,240 B2 * | 12/2014 | Biddle ............... H01R 12/7005 439/63 |
| 9,041,806 B2 | 5/2015 | Baur et al. |
| 9,126,525 B2 | 9/2015 | Lynam |
| 9,233,641 B2 | 1/2016 | Sesti et al. |
| 9,307,640 B2 | 4/2016 | Sigle |
| 9,609,757 B2 | 3/2017 | Steigerwald |
| 2011/0310248 A1 | 12/2011 | McElroy et al. |
| 2012/0218412 A1 | 8/2012 | Dellantoni |
| 2013/0222595 A1 | 8/2013 | Gebauer et al. |
| 2013/0242099 A1 | 9/2013 | Sauer et al. |
| 2013/0328672 A1 | 12/2013 | Sesti et al. |
| 2013/0344736 A1 | 12/2013 | Latunski |
| 2014/0138140 A1 | 5/2014 | Sigle |
| 2014/0218535 A1 | 8/2014 | Ihlenburg et al. |
| 2014/0320636 A1 | 10/2014 | Bally et al. |
| 2014/0340510 A1 | 11/2014 | Ihlenburg |
| 2014/0362209 A1 | 12/2014 | Ziegenspeck et al. |
| 2014/0373345 A1 | 12/2014 | Steigerwald |
| 2015/0042807 A1 | 2/2015 | Ihlenburg et al. |
| 2015/0222795 A1 * | 8/2015 | Sauer ................... H04N 5/2257 348/148 |
| 2015/0266430 A1 | 9/2015 | Mleczko et al. |
| 2015/0365569 A1 | 12/2015 | Mai et al. |
| 2016/0037028 A1 | 2/2016 | Biemer |
| 2016/0268716 A1 | 9/2016 | Conger et al. |
| 2017/0133811 A1 | 5/2017 | Conger et al. |
| 2017/0201661 A1 | 7/2017 | Conger |
| 2017/0295306 A1 | 10/2017 | Mleczko |
| 2017/0302829 A1 | 10/2017 | Mleczko et al. |

* cited by examiner

*Prior Art*

FIG. 3A

*Prior Art*

VEHICLE CAMERA WITH SMD PAD FOR COAXIAL CABLE CONNECTION

CROSS REFERENCE TO RELATED APPLICATION

The present application claims the filing benefits of U.S. provisional application Ser. No. 62/351,321, filed Jun. 17, 2016, which is hereby incorporated herein by reference in its entirety.

FIELD OF THE INVENTION

The present invention relates generally to a vehicle vision system for a vehicle and, more particularly, to a vehicle vision system that utilizes one or more cameras at a vehicle.

BACKGROUND OF THE INVENTION

Use of imaging sensors in vehicle imaging systems is common and known. Examples of such known systems are described in U.S. Pat. Nos. 5,949,331; 5,670,935 and/or 5,550,677, which are hereby incorporated herein by reference in their entireties. In high speed digital data transmission in automotive applications, such as sensors or displays or infotainment systems, shielded coaxial cable is used for its excellent isolation of the signal and ground path from each other, and from electromagnetic interference (EMI) issues with adjacent electrical components. The device's PCB typically contains a coaxial header, and the device's housing would have a mating jack to engage this header. This method of connection to the PCB requires intricate machining, casting, or stamping operations which increase cost and reduce design flexibility.

SUMMARY OF THE INVENTION

The present invention provides a vision system or imaging system for a vehicle that utilizes one or more cameras (preferably one or more CMOS cameras) to capture image data representative of images exterior of the vehicle, and provides enhanced electrical connection between a coaxial connector and circuitry of a printed circuit board of the camera. The connection provides a solder pad for connecting to the shielding of the coaxial connector, with the shielding solder pad only partially circumscribing the center solder pad for connecting to the core pin of the coaxial connector. The gap in the shielding solder pad allows for gases that are evaporating out of the solder during the soldering process to escape during the soldering process and thus limits or substantially precludes potential displacement of coaxial header SMD components.

These and other objects, advantages, purposes and features of the present invention will become apparent upon review of the following specification in conjunction with the drawings.

DESCRIPTION OF THE PREFERRED EMBODIMENTS

A vehicle vision system and/or driver assist system and/or object detection system and/or alert system operates to capture images exterior of the vehicle and may process the captured image data to display images and to detect objects at or near the vehicle and in the predicted path of the vehicle, such as to assist a driver of the vehicle in maneuvering the vehicle in a rearward direction. The vision system includes an image processor or image processing system that is operable to receive image data from one or more cameras and provide an output to a display device for displaying images representative of the captured image data. Optionally, the vision system may provide a top down or bird's eye or surround view display and may provide a displayed image that is representative of the subject vehicle, and optionally with the displayed image being customized to at least partially correspond to the actual subject vehicle.

Figure 1:
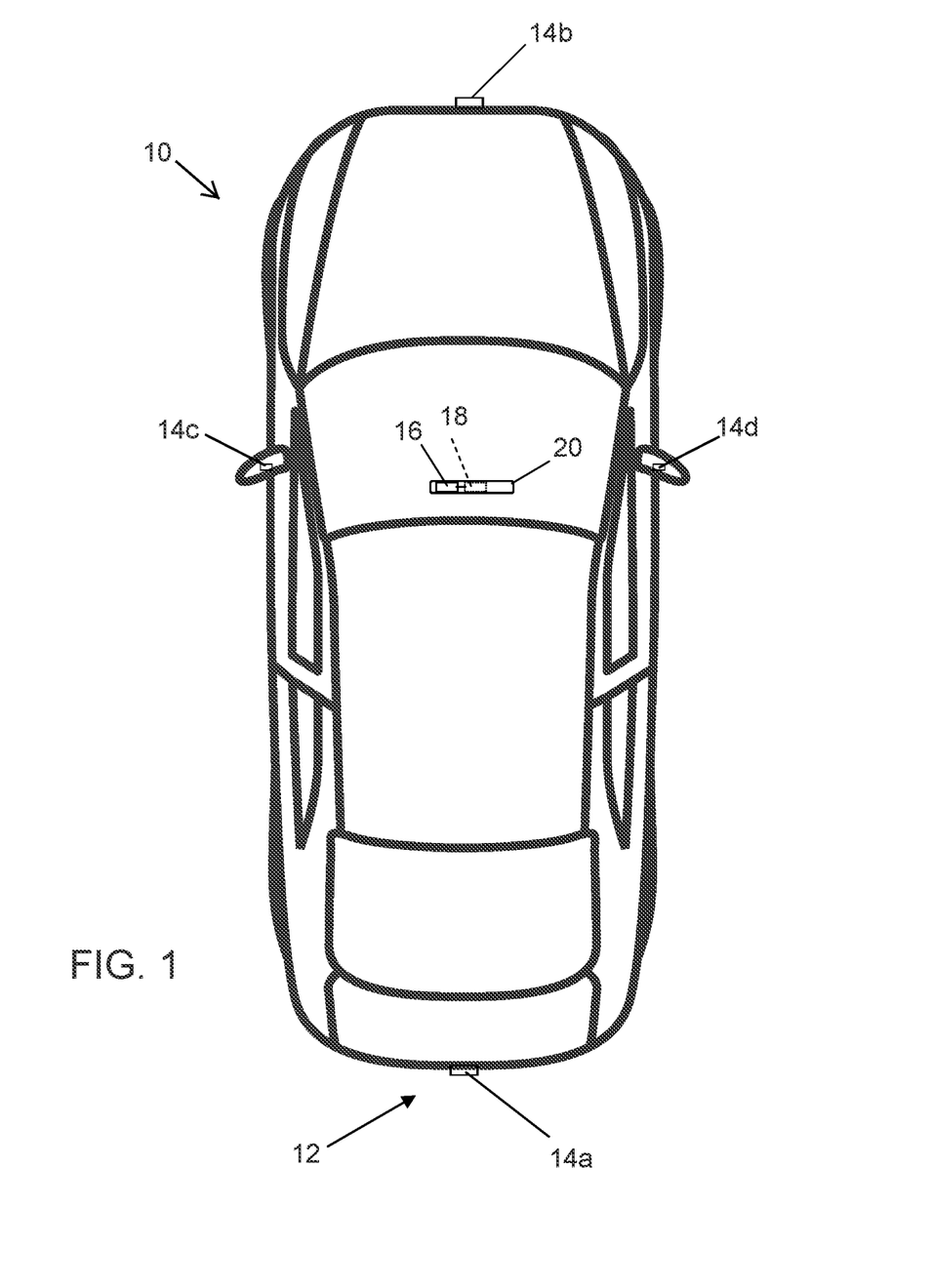
FIG. 1 is a plan view of a vehicle with a vision system that incorporates cameras in accordance with the present invention.
Figure 2:
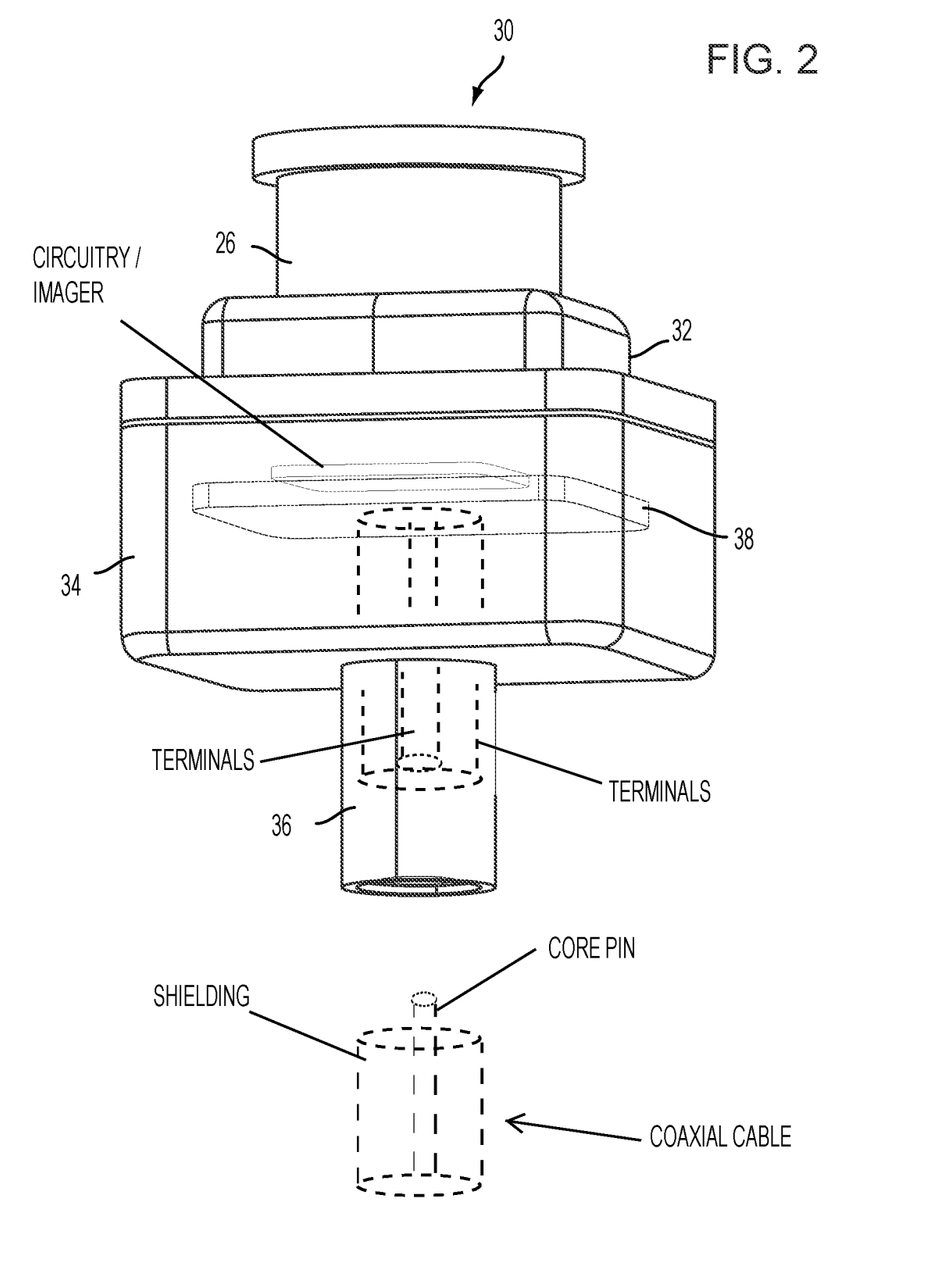
FIG. 2 is a perspective view of a camera of the present invention.

Referring now to the drawings and the illustrative embodiments depicted therein, a vehicle 10 includes an imaging system or vision system 12 that includes at least one exterior facing imaging sensor or camera, such as a rearward facing imaging sensor or camera 14a (and the system may optionally include multiple exterior facing imaging sensors or cameras, such as a forward facing camera 14b at the front (or at the windshield) of the vehicle, and a sideward/rearward facing camera 14c, 14d at respective sides of the vehicle), which captures images exterior of the vehicle, with the camera having a lens for focusing images at or onto an imaging array or imaging plane or imager of the camera (FIG. 2). The vision system 12 includes a control or electronic control unit (ECU) or processor 18 that is operable to process image data captured by the cameras and may provide displayed images at a display device 16 for viewing by the driver of the vehicle (although shown in FIG. 2 as being part of or incorporated in or at an interior rearview mirror assembly 20 of the vehicle, the control and/or the display device may be disposed elsewhere at or in the vehicle). The data transfer or signal communication from the camera to the ECU may comprise any suitable data or communication link, such as a vehicle network bus or the like of the equipped vehicle.

The camera or camera module 30 includes an imager at an image plane and a lens holder or lens barrel 26 that holds the lens relative to the imager. During assembly of the camera module, the lens barrel is positioned relative to the imager's image plane to provide the desired focusing of images at the image plane by the lens. For example, the camera module 30 may include a front housing portion 32 and a rear housing portion 34, with the lens barrel 26 mounting at the front housing portion and with an electrical connector portion 36 (for connecting to a coaxial connector or coaxial cable of the vehicle or the like) provided at the rear housing portion. The front and/or rear housing portions support and house a circuit element or printed circuit board 38 therein, with the circuit element having the imager (and associated circuitry) disposed thereat. The lens barrel attaches or mounts to the front housing portion such that, when so attached, the lens may focus (or slightly blur) images at the image plane of the imager. For example, the flange of the lens barrel may engage corresponding structure at the front housing portion during the assembly process to locate the lens barrel and lens relative to the imager and image plane.

When surface mount device (SMD) soldering coaxial connector sockets, such as at a circuit board of a camera or the like, there is typically a center SMD pad for contacting the core pin and a circumferential SMD pad for connecting the coaxial connector's shielding.

Figure 3A:
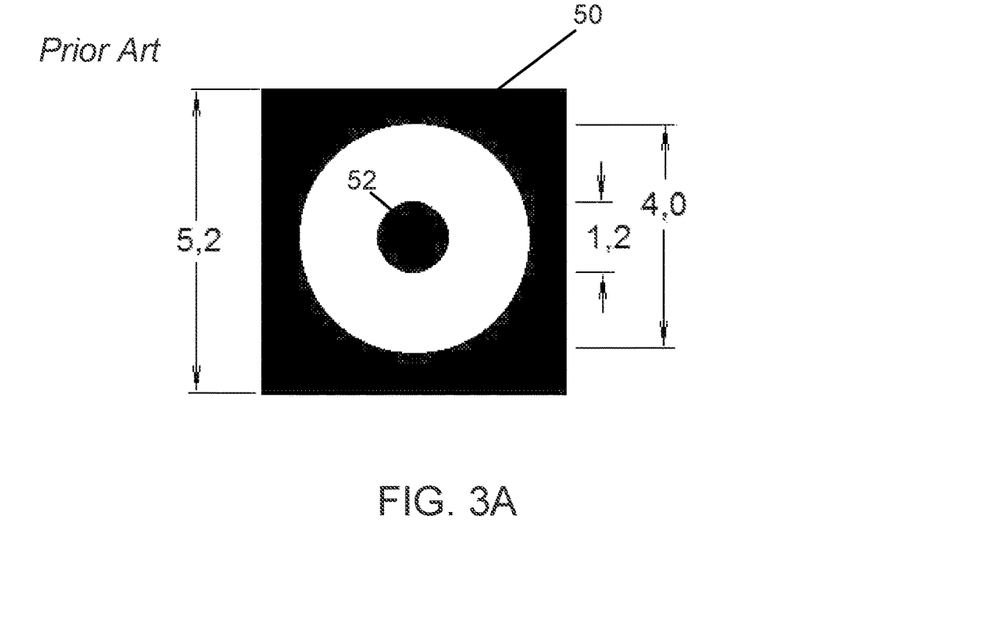
FIG. 3A is a plan view of a known central solder pad and a circumferential solder pad.
Figure 3B:
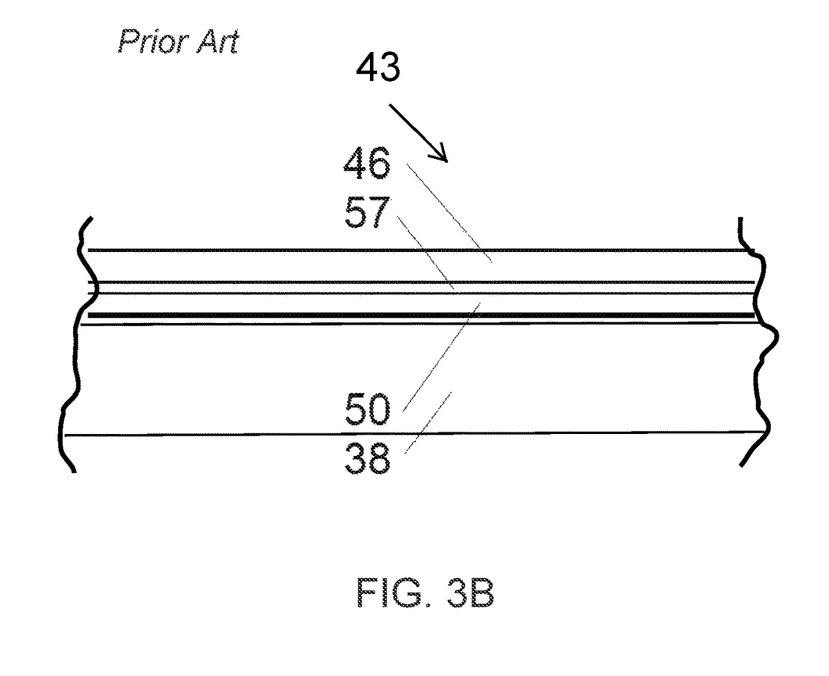
FIG. 3B is a close up sectional view of a solder joint connection past soldering of a coaxial header, with its shielding node soldered onto a circumferential solder pad that is on a PCB.

As shown in FIGS. 3A and 3B, the area of the core soldering pad 52 is typically and conventionally fully enclosed or fully circumscribed by the circumferential soldering pad 50 area of the shielding. These two pads 52 and 50 are on the top layer of the PCB 38. Thus, since the coaxial header component 43 (see FIGS. 5A and 5B) that is meant to be soldered on top of the soldering pad 50 is solid, the SMD area underneath the component is fully enclosed.

The gases that typically evaporate from the solder 53 during the soldering process can lead to a gas pressure within the enclosed area at the connection which may lift and shift the component and may bubble through the fluid solder in an uncontrolled manner, which can lead to displaced components and insufficient solder distribution, which may in turn diminish the desired contact and EMC performance.

Figure 4A:
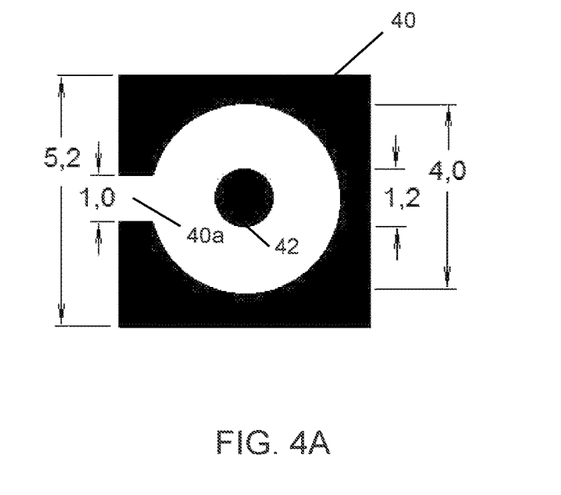
FIG. 4A is a plan view of a central solder pad and a circumferential solder pad having a gap therein in accordance with the present invention.
Figure 4B:
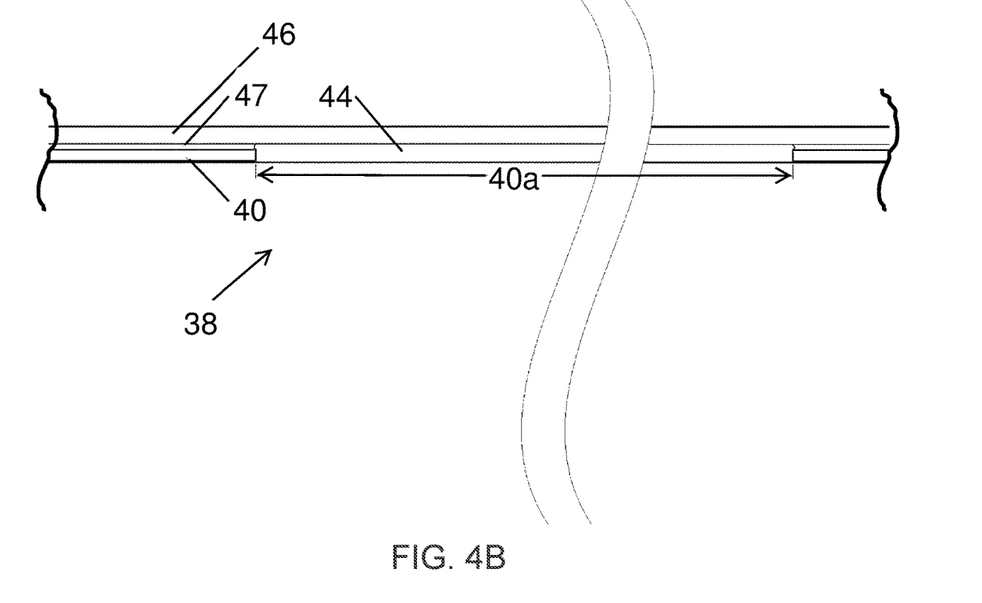
FIG. 4B is a close up sectional view of a solder joint connection past soldering of a coaxial header (43), with its shielding node (46) soldered (solder 47) onto a circumferential solder pad (40) according the invention with a gap (40a), which prevents solder from filling the gas release hole (44) on the PCB (38)

For coping with the potential displacement of coaxial header SMD components 43, the present invention provides an enhanced SMD pad design. As shown in FIGS. 4A and 4B (shown in two dimensional (2D) form) and in FIGS. 5A and 5B (in three dimensional (3D) form), the pad according the present invention has a spared section or gap 40a (devoid of solder) within the circumferential shielding SMD pad 40 (that partially circumscribes the core pin SMD pad 42). No solder will be present in that region (in extension of the gap 40a in the SMD pad 40) during soldering. By that, the spared section or gap will serve as gas release hole 44 during the soldering process so as to release or vent gases evaporating from the solder 47 under the coaxial header component. The spared section or gap may be established at any location of the shield header node 46.

Figure 5A:
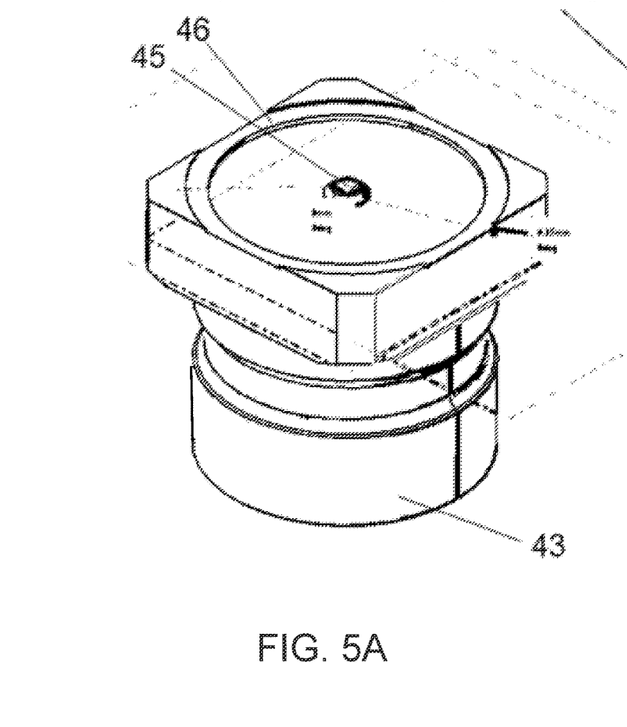
FIG. 5A is a perspective bottom view of a coaxial header before soldering.
Figure 5B:
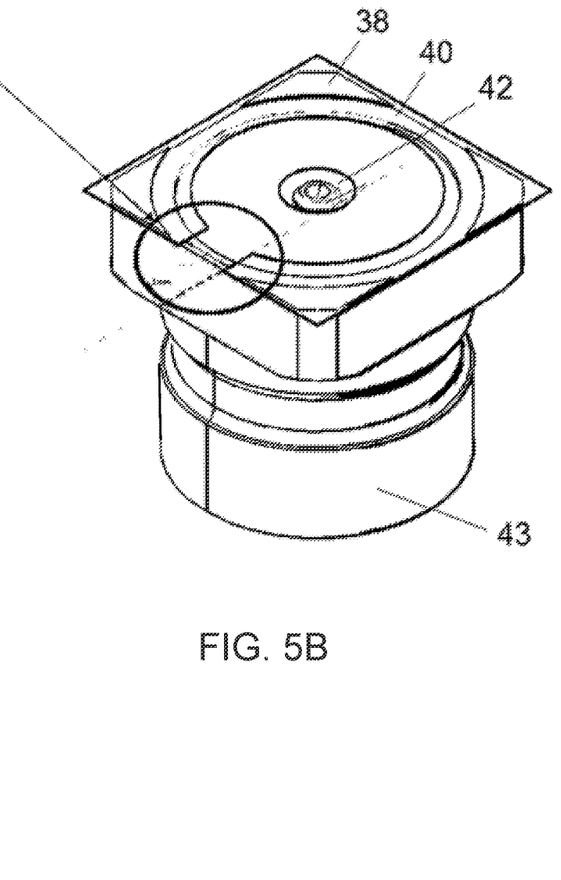
FIG. 5B is a perspective bottom view of a coaxial header (43) before soldering with a solder pad (40) (on a PCB 38) with a gap (40a) according the invention projected onto it, with the PCB shown transparent for giving view to the location of the solder pads (40 and 42) in a real relation to the coaxial header's shield node (46) and center pin (45)

In order to not lose or degrade the shielding effect, the spared section may be as minimal as required for releasing the gas. In the example of FIG. 4, the spared section takes about one twelfth of the circumferential SMD pad or the shielding. The height at the gap may be very small, such as less than around 0.2 mm or such as around 0.15 mm as shown in FIG. 5.

Figure 6:
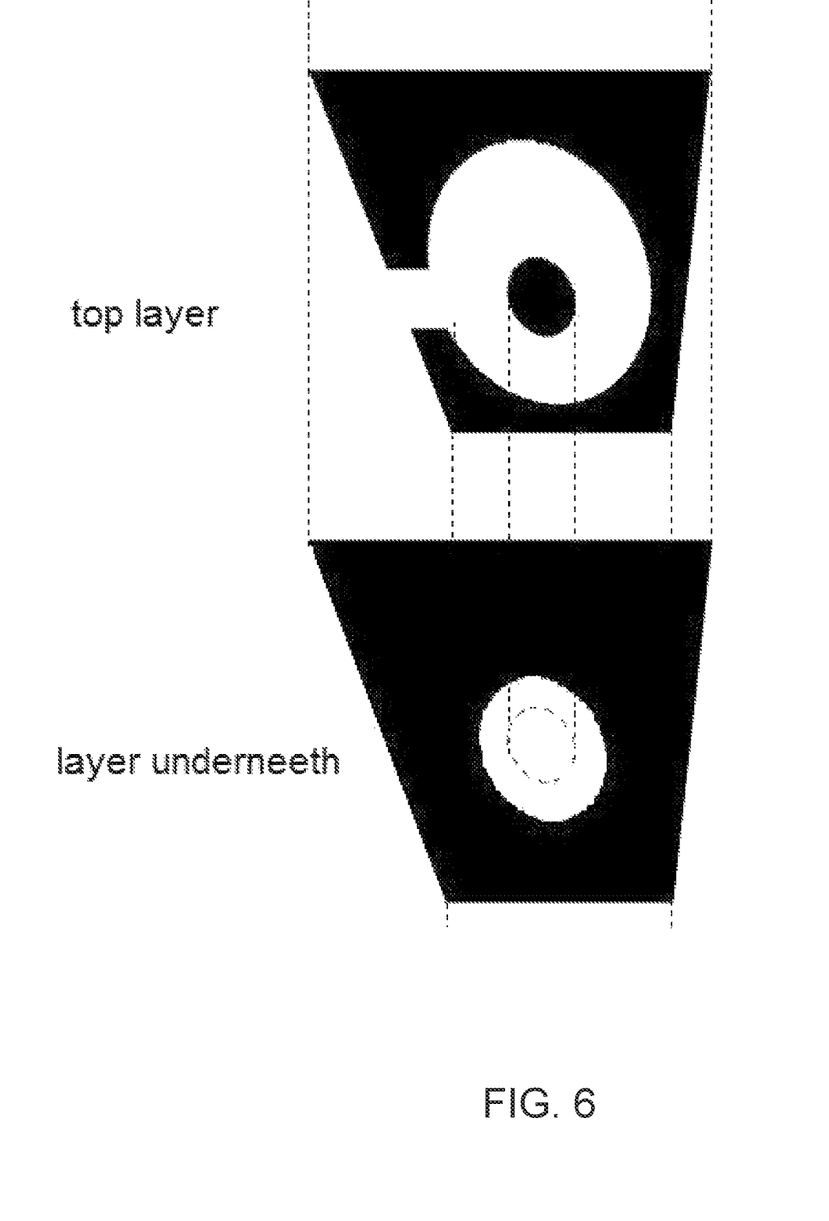
FIG. 6 is an exploded view showing a shielding layer underneath the SMD layers in accordance with the present invention.

For additionally retaining the shielding properties, another PCB layer below the top layer may have shielding potential, especially in the area underneath the coaxial header. FIG. 6 shows an example of such a sublayer below the top layer SMD pad in accordance with the invention. The sublayer may have an aperture therethrough for the center pin connection, and may fully circumscribe the aperture.

Although shown and described as being part of a vehicle camera, it is envisioned that aspects of the SMD pad may be utilized in other applications where a coaxial connector is soldered to a printed circuit board.

The connection of the present invention may electrically connect a coaxial wiring connector to a printed circuit board of a device, such as a camera of a vehicle vision system. The connection and camera may utilize aspects of the connections and cameras described in U.S. Pat. Nos. 9,307,640; 9,233,641 and/or 8,866,907 and/or U.S. Publication Nos. US-2013-0328672; US-2014-0320636; US-2013-0222595; US-2013-0344736; US-2014-0373345; US-2013-0242099; US-2015-0222795; US-2015-0266430; US-2015-0365569; US-2016-0037028; US-2016-0268716 and/or US-2017-0133811, and/or U.S. patent applications, Ser. No. 15/467,246, filed Mar. 23, 2017, Ser. No. 15/478,274, filed Apr. 4, 2017, and/or Ser. No. 15/487,459, filed Apr. 14, 2017, which are all hereby incorporated herein by reference in their entireties.

The camera is configured to electrically connect to a coaxial cable connector. Such coaxial cables fulfill various functions, such as for an Ethernet connection. Transmission of video data over coaxial cabling and utilizing the connectors of the present invention has several advantages, including enhanced protection against hacking or corruption due to cyber-attacks and the like on a vehicle equipped with the vehicle cameras and connection system of the present invention. For example, in a surround vision system comprising at least three vehicle cameras, it is preferred to use Ethernet cabling and the connection system of the present invention for transmission of image data captured by the respective video cameras of a vehicular multi-camera surround vision system to a central ECU where video manipulation and image stitching can be performed to generate a composite bird's eye or top view or panoramic view image for display to a driver of the equipped vehicle. Ethernet equipped vision systems that benefit from the vehicle cameras and connecting system of the present invention include systems of the types described in U.S. Pat. Nos. 9,126,525 and/or 9,041,806 and/or U.S. Publication Nos. US-2015-0042807; US-2014-0340510; US-2014-0218535 and/or US-2012-0218412, which are hereby incorporated herein by reference in their entireties.

The camera or sensor may comprise any suitable camera or sensor. Optionally, the camera may comprise a "smart camera" that includes the imaging sensor array and associated circuitry and image processing circuitry and electrical connectors and the like as part of a camera module, such as by utilizing aspects of the vision systems described in International Publication Nos. WO 2013/081984 and/or WO 2013/081985, which are hereby incorporated herein by reference in their entireties.

The system includes an image processor operable to process image data captured by the camera or cameras, such as for detecting objects or other vehicles or pedestrians or the like in the field of view of one or more of the cameras. For example, the image processor may comprise an image processing chip selected from the EyeQ family of image processing chips available from Mobileye Vision Technologies Ltd. of Jerusalem, Israel, and may include object detection software (such as the types described in U.S. Pat. Nos. 7,855,755; 7,720,580 and/or 7,038,577, which are hereby incorporated herein by reference in their entireties), and may analyze image data to detect vehicles and/or other objects. Responsive to such image processing, and when an object or other vehicle is detected, the system may generate an alert to the driver of the vehicle and/or may generate an overlay at the displayed image to highlight or enhance display of the detected object or vehicle, in order to enhance the driver's awareness of the detected object or vehicle or hazardous condition during a driving maneuver of the equipped vehicle.

The vehicle may include any type of sensor or sensors, such as imaging sensors or radar sensors or lidar sensors or ladar sensors or ultrasonic sensors or the like. The imaging sensor or camera may capture image data for image processing and may comprise any suitable camera or sensing device, such as, for example, a two dimensional array of a plurality of photosensor elements arranged in at least 640 columns and 480 rows (at least a 640×480 imaging array, such as a megapixel imaging array or the like), with a respective lens focusing images onto respective portions of the array. The photosensor array may comprise a plurality of photosensor elements arranged in a photosensor array having rows and columns. Preferably, the imaging array has at least 300,000 photosensor elements or pixels, more preferably at least 500,000 photosensor elements or pixels and more preferably at least 1 million photosensor elements or pixels. The imaging array may capture color image data, such as via spectral filtering at the array, such as via an RGB (red, green and blue) filter or via a red/red complement filter or such as via an RCC (red, clear, clear) filter or the like. The logic and control circuit of the imaging sensor may function in any known manner, and the image processing and algorithmic processing may comprise any suitable means for processing the images and/or image data.

For example, the vision system and/or processing and/or camera and/or circuitry may utilize aspects described in U.S. Pat. Nos. 8,694,224; 7,005,974; 5,760,962; 5,877,897; 5,796,094; 5,949,331; 6,302,545; 6,396,397; 6,498,620; 6,523,964; 6,611,202; 6,201,642; 6,690,268; 6,717,610; 6,757,109; 6,802,617; 6,806,452; 6,822,563; 6,891,563; 6,946,978; 7,859,565; 5,550,677; 5,670,935; 7,881,496; 7,720,580; 7,038,577; 6,882,287; 5,929,786 and/or 5,786,772, which are all hereby incorporated herein by reference in their entireties. The system may communicate with other communication systems via any suitable means, such as by utilizing aspects of the systems described in International Publication Nos. WO/2010/144900; WO 2013/043661 and/or WO 2013/081985, and/or U.S. Publication No. US-2012-0062743, which are hereby incorporated herein by reference in their entireties.

Optionally, the vision system may include a display for displaying images captured by one or more of the imaging sensors for viewing by the driver of the vehicle while the driver is normally operating the vehicle. Optionally, for example, the vision system may include a video display device utilizing aspects of the video display systems described in U.S. Pat. No. 6,690,268; 7,370,983; 7,329,013; 7,308,341; 7,289,037; 7,249,860; 7,004,593; 4,546,551; 5,699,044; 4,953,305; 5,576,687; 5,632,092; 5,677,851; 5,708,410; 5,737,226; 5,802,727; 5,878,370; 6,087,953; 6,173,508; 6,222,460; 6,513,252 and/or 6,642,851, and/or U.S. Publication Nos. US-2012-0162427 and/or US-2006-0061008, which are hereby incorporated herein by reference in their entireties. Optionally, the vision system (utilizing the forward facing camera and a rearward facing camera and other cameras disposed at the vehicle with exterior fields of view) may be part of or may provide a display of a top-down view or birds-eye view system of the vehicle or a surround view at the vehicle, such as by utilizing aspects of the vision systems described in International Publication Nos. WO 2010/099416; WO 2011/028686; WO 2012/075250; WO 2013/019795; WO 2012/075250; WO 2012/145822; WO 2013/081985; WO 2013/086249 and/or WO 2013/109869, and/or U.S. Publication No. US-2012-0162427, which are hereby incorporated herein by reference in their entireties.

Changes and modifications in the specifically described embodiments can be carried out without departing from the principles of the invention, which is intended to be limited only by the scope of the appended claims, as interpreted according to the principles of patent law including the doctrine of equivalents.

The invention claimed is:

1. A camera for a vision system of a vehicle, said camera comprising:
    a front housing portion comprising a lens;
    a circuit board having circuitry established thereat, wherein said circuitry is associated with an imager of said camera;
    a rear housing portion having a connector portion configured for connection of a coaxial cable of a vehicle when said camera is disposed at the vehicle;
    wherein said circuit board comprises a first solder pad for soldering a core pin connecting element, and wherein said circuit board comprises a second solder pad that partially circumscribes said first solder pad for soldering a shielding connecting element;
    wherein said second solder pad only partially circumscribes said first solder pad so as to have a gap between opposing ends of said second solder pad, and wherein said gap is configured to allow for escape of gases that evaporate out of the solder during the soldering process;
    a shielding sublayer disposed between said second solder pad and said circuit board, and wherein said shielding sublayer provides enhanced shielding;
    wherein said shielding sublayer has an aperture therethrough to accommodate said first solder pad, and wherein said shielding sublayer fully circumscribes the aperture and does not electrically conductively connect with said first solder pad; and
    wherein said core pin connecting element electrically connects between a core pin of the connected coaxial cable and circuitry of said circuit board, and wherein said shielding connecting element electrically connects between shielding of the connected coaxial cable and circuitry of said circuit board.

2. The camera of claim 1, wherein said gap between opposing ends of said second solder pad spans less than one tenth of the circumferential dimension of said second solder pad.

3. The camera of claim 1, wherein a height dimension of said second solder pad at said gap is less than 0.2 mm.

4. The camera of claim 1, wherein the soldering process comprises heating said first solder pad and said second solder pad to melt solder disposed thereat.

5. The camera of claim 1, wherein said core pin connecting element and said shielding connecting element are part of a coaxial header element that is disposed at said circuit board.

6. The camera of claim 5, wherein said first solder pad and said second solder pad are heated to melt solder disposed thereat when said coaxial header element is disposed at said circuit board.

7. The camera of claim 5, wherein said coaxial header electrically connects to terminals of said connector portion of said rear housing portion to electrically connect the core pin and the shielding of the connected coaxial cable to respective circuitry of said circuit board.

8. A camera for a vision system of a vehicle, said camera comprising:

a front housing portion comprising a lens;

a circuit board having circuitry established thereat, wherein said circuitry is associated with an imager of said camera;

a rear housing portion having a connector portion configured for connection of a coaxial cable of a vehicle when said camera is disposed at the vehicle;

a coaxial header element comprising a core pin connecting element and a shielding connecting element;

wherein said circuit board comprises a first solder pad for soldering said core pin connecting element at said circuit board, and wherein said circuit board comprises a second solder pad that partially circumscribes said first solder pad for soldering said shielding connecting element at said circuit board;

wherein said first solder pad and said second solder pad are configured to be heated to melt solder disposed thereat when said coaxial header element is disposed at said circuit board;

wherein said second solder pad only partially circumscribes said first solder pad so as to have a gap between opposing ends of said second solder pad, and wherein said gap is configured to allow for escape of gases that evaporate out of the solder during the soldering process;

a shielding sublayer disposed between said second solder pad and said circuit board, and wherein said shielding sublayer provides enhanced shielding;

wherein said shielding sublayer has an aperture therethrough to accommodate said first solder pad, and wherein said shielding sublayer fully circumscribes the aperture and does not electrically conductively connect with said first solder pad;

wherein said core pin connecting element electrically connects between a core pin of the connected coaxial cable and circuitry of said circuit board, and wherein said shielding connecting element electrically connects between shielding of the connected coaxial cable and circuitry of said circuit board; and wherein said coaxial header electrically connects to terminals of said connector portion of said rear housing portion to electrically connect the core pin and the shielding of the connected coaxial cable to said core pin connecting element and said shielding connecting element, respectively, and to the respective circuitry of said circuit board.

9. The camera of claim 8, wherein said gap between opposing ends of said second solder pad spans less than one tenth of the circumferential dimension of said second solder pad.

10. The camera of claim 8, wherein a height dimension of said second solder pad at said gap is less than 0.2 mm.

11. A camera for a vision system of a vehicle, said camera comprising:

a front housing portion comprising a lens;

a circuit board having circuitry established thereat, wherein said circuitry is associated with an imager of said camera;

a rear housing portion having a connector portion configured for connection of a coaxial cable of a vehicle when said camera is disposed at the vehicle;

wherein said circuit board comprises a first solder pad for soldering a core pin connecting element, and wherein said circuit board comprises a second solder pad that partially circumscribes said first solder pad for soldering a shielding connecting element;

wherein said second solder pad only partially circumscribes said first solder pad so as to have a gap between opposing ends of said second solder pad, and wherein said gap is configured to allow for escape of gases that evaporate out of the solder during the soldering process;

wherein the soldering process comprises heating said first solder pad and said second solder pad to melt solder disposed thereat;

a shielding sublayer disposed between said second solder pad and said circuit board, and wherein said shielding sublayer provides enhanced shielding;

wherein said shielding sublayer has an aperture therethrough to accommodate said first solder pad, and wherein said shielding sublayer fully circumscribes the aperture and does not electrically conductively connect with said first solder pad; and wherein said core pin connecting element electrically connects between a core pin of the connected coaxial cable and circuitry of said circuit board, and wherein said shielding connecting element electrically connects between shielding of the connected coaxial cable and circuitry of said circuit board.

12. The camera of claim 11, wherein said core pin connecting element and said shielding connecting element electrically connect to respective terminals of said connector portion of said rear housing portion to electrically connect the core pin and the shielding of the connected coaxial cable to respective circuitry of said circuit board.

13. The camera of claim 11, wherein a height dimension of said second solder pad at said gap is less than 0.2 mm.

14. The camera of claim 11, wherein said gap between opposing ends of said second solder pad spans less than one tenth of the circumferential dimension of said second solder pad.

15. The camera of claim 14, wherein said core pin connecting element and said shielding connecting element are part of a coaxial header element that is disposed at said circuit board.

* * * * *